United States Patent [19]

Benasutti

[11] 4,080,027

[45] Mar. 21, 1978

[54] ELECTRICAL CONTACT AND CONNECTOR

[75] Inventor: John Eugene Benasutti, Oil City, Pa.

[73] Assignee: GTE Sylvania Incorporated, Stamford, Conn.

[21] Appl. No.: 710,289

[22] Filed: Jul. 30, 1976

[51] Int. Cl.[2] .................................... H05K 1/07

[52] U.S. Cl. ............................ 339/17 F; 339/75 MP; 339/176 MP

[58] Field of Search .............. 339/17 F, 17 L, 17 LC, 339/17 M, 74 R, 75 MP, 176 MF, 176 MP

[56] References Cited

U.S. PATENT DOCUMENTS

| | | | |
|---|---|---|---|
| 3,008,113 | 4/1961 | Johnson | 339/176 MP |
| 3,243,762 | 3/1966 | Tamburro | 339/17 LM |
| 3,444,503 | 5/1969 | Mallery | 339/74 R |
| 3,638,166 | 1/1972 | Steipe | 339/176 MP |
| 3,818,419 | 6/1974 | Crane | 339/74 R |

*Primary Examiner*—Roy Lake
*Assistant Examiner*—Mark S. Bicks
*Attorney, Agent, or Firm*—Gordon G. Menzies; N. J. O'Malley; D. R. Castle

[57] ABSTRACT

There is disclosed an electrical contact which comprises a substantially rigid electrically conductive body and a substantially flexible contacting portion electrically connected thereto. The contacting portion includes a first segment of insulative material and a second segment of conductive material secured to a selected area on the first segment. The contact is ideally suited for use within a zero force printed circuit board connector, said connector also disclosed.

6 Claims, 8 Drawing Figures

Fig. 5
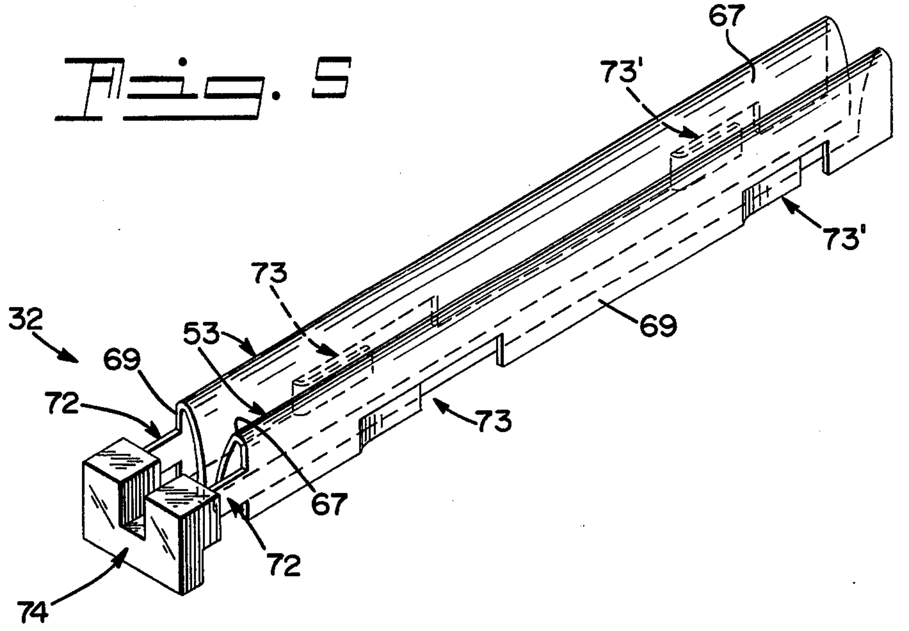
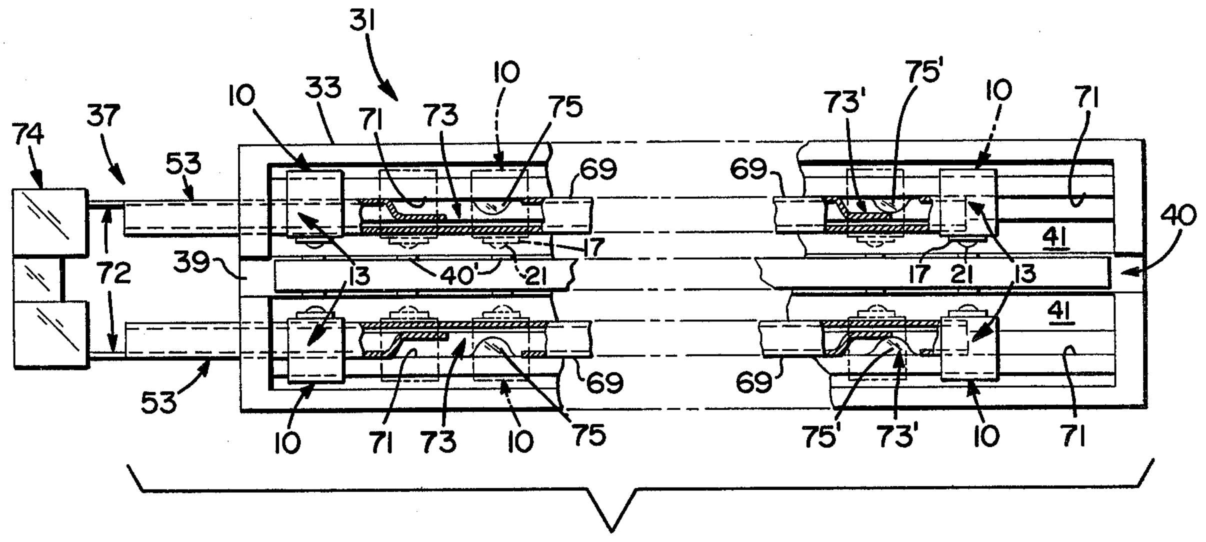
Fig. 6

ELECTRICAL CONTACT AND CONNECTOR

BACKGROUND OF THE INVENTION

The invention relates to electrical contacts. Additionally, x679010340027Crelates to electrical connectors which utilize electrical contact. Even further, the invention relates to the above electrical connectors wherein said connectors are of the zero force variety.

The present invention involves a unique concept in the manufacture of electrical contacts. Electrical contacts, particularly those utilized in electrical connectors, have heretofore been manufactured from a solid metallic strip or wire wherein the strip or wire was subjected to a plurality of forming operations, e. g. stamping, coining, and bending. The wire or strip was thereafter segmented with each individual segment defining a singular contact usually containing tail, retention, and tine (contacting) portions. It was considered necessary to produce the contacting portions of these contacts from metallic stock to facilitate the above several operations in addition to assuring a degree of rigidity for this portion.

The present invention eliminates the need for several of the above operations by providing an electrical contact which includes a flexible contacting portion comprised of a first segment of electrically insulative material. A second segment of conductive material is secured to a selected area on the first segment and the entire contacting portion is electrically connected to the contact's body. The contact of the invention is ideally suited for utilization within an electrical connector and particularly a printed circuit board (PCB) connector of the zero force variety. As is well known in the art, zero force PCB connectors permit insertion and removal of a circuit board within the connector's housing without an interfering engagement between the board and the connector's contacts. The necessary board-contact engaging forces are subsequently applied by use of an actuator such as a rotative cam. Non-interfering positioning of the board eliminates a "wiping" of the surfaces of the board and contact, said "wiping" adversely affecting said surfaces by incrementally removing portions thereof or by causing contaminants to become formed thereon.

As stated, provision of a contact which uses a flexible contacting portion containing in part a non-metallic segment eliminates many of the above several operations required to produce said contact. Additionally, the above features facilitate positioning of the contact within an electrical connector. It can be seen that the contacts and connectors of the invention thus possess an inherent cost advantage over known prior art components.

It is believed, therefore, that a contact and connector possessing the features described above would constitute an advancement in the art.

OBJECTS AND SUMMARY OF THE INVENTION

It is therefore a primary object of the present invention to enhance the electrical contact art.

It is another object of the invention to provide an electrical contact which may be manufactured without requiring several of the operations heretofore considered necessary in the prior art.

It is still another object of the invention to provide a new electrical contact which is ideally suited for use within an electrical connector, thus enhancing the connector art.

It is an even further object of the invention to provide a new electrical contact which may be incorporated within a zero force printed circuit board connector.

In accordance with one aspect of the invention, there is provided an electrical contact which comprises a substantially rigid electrically conductive body and a flexible contacting portion, said portion including a first segment of insulative material and a second segment of conductive material secured to a selected area thereon.

In accordance with another aspect of the invention, there is provided a zero force printed circuit board connector which comprises an insulative housing, an electrical contact comprising a body and a contacting portion including a first segment of insulative material and a second segment of conductive material secured to a selected area thereon, and an actuation means for engaging the first segment of the contact to effect electrical engagement between the second segment and a conductive area on the circuit board.

BRIEF DESCRIPTION OF THE DRAWINGS

FIG. 5 is an isometric view of a preferred actuation means for the connector of FIG. 2; and FIGS. 6–8 are top plan views of the connector of FIG. 2 illustrating the various positioning relationships of the components therein.

DETAILED DESCRIPTION OF THE PREFERRED EMBODIMENTS

For a better understanding of the present invention, together with other and further objects, advantages and capabilities thereof reference is made to the following disclosure and appended claims in connection with the above-described drawings.

Figure 1:
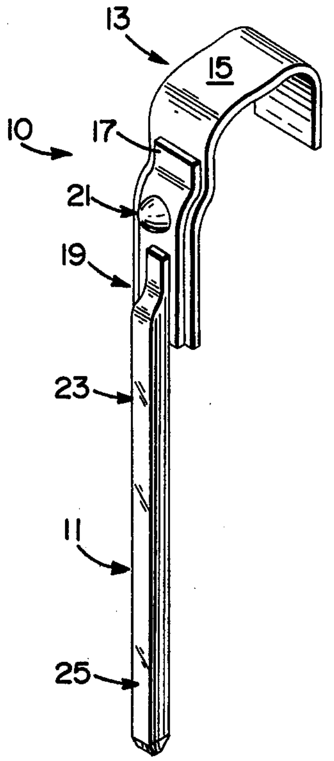
FIG. 1 is an isometric view of an electrical contact in accordance with a preferred embodiment of the invention.

With particular reference to the drawings, there is shown in FIG. 1 an electrical contact 10 in accordance with a preferred embodiment of the invention. Contact 10 comprises a substantially rigid electrically conductive body 11 and a substantially flexible contacting portion 13. Contacting portion 13 includes a first segment 15 of electrically insulative material and a second segment 17 of electrically conductive material secured to a selected area on first segment 15. It can be seen in FIG. 1 that portion 13 is adjoining and electrically connected to body 11, preferably by soldering or welding segment 17 to body 11 at a jointure 19.

It is preferred to utilize a metallic material, e.g. phosphor bronze, for body 11. In accordance with one embodiment of the invention, body 11 is produced from a 0.025 inch square wire. The preferred insulative material for segment 15 is plastic, e.g. Mylar or nylon. Said material is shown as being relatively thin and in the preferred embodiment of the invention has a thickness within the range of from about 0.003 inches to about 0.010 inches. The preferred material for second segment 17 is a layer of a sound electrically conductive metal such as copper, said layer preferably having a thickness within the range of from about 0.002 inches to about 0.005 inches when using the aforementioned thicknesses for first segment 15. One method of securing segment 17 to first segment 15 is plating, said method similar to that used in applying copper conductive areas on rigid printed circuit board substrates. In the broader aspects of the invention, it is understood that layer 17 could be applied by other methods including utilization of an epoxy or similar bonding agent.

When using the above thicknesses, it can be seen that contacting portion 13 is substantially pliable and therefore permits flexure and bending thereof.

In another embodiment of the invention, second segment 17 of contacting portion 13 further includes a second metallic material 21 dissimilar to the metal for segment 17 and secured to a selected region thereon. The primary function of material 21 is to enhance the electrical conductive properties of portion 13. Accordingly, material 21 is preferably a noble metal such as gold, silver, or alloys thereof, said metals well known in the art as possessing low oxidation and excellent electrically conductive properties. Such properties are considered essential for electrical contacts employed in electrical connectors. Metallic material 21 is preferably secured to layer 17 by welding, plating, or similar operations. A well known procedure in the contact forming art is the "gold dot" welding technique wherein a gold wire is fed perpendicularly to a horizontally aligned metallic substrate, e.g. contact tine, with portions of the wire attached to said tine. The resulting gold configurations are "dot" or round shaped, similar to the embodiment shown in FIG. 1.

When contact 10 is utilized in an electrical connector, it is preferred that body 11 include a retention portion 23 and a tail 25. The purposes for these portions will be defined with the description of FIGS. 3 and 4.

Figure 2:
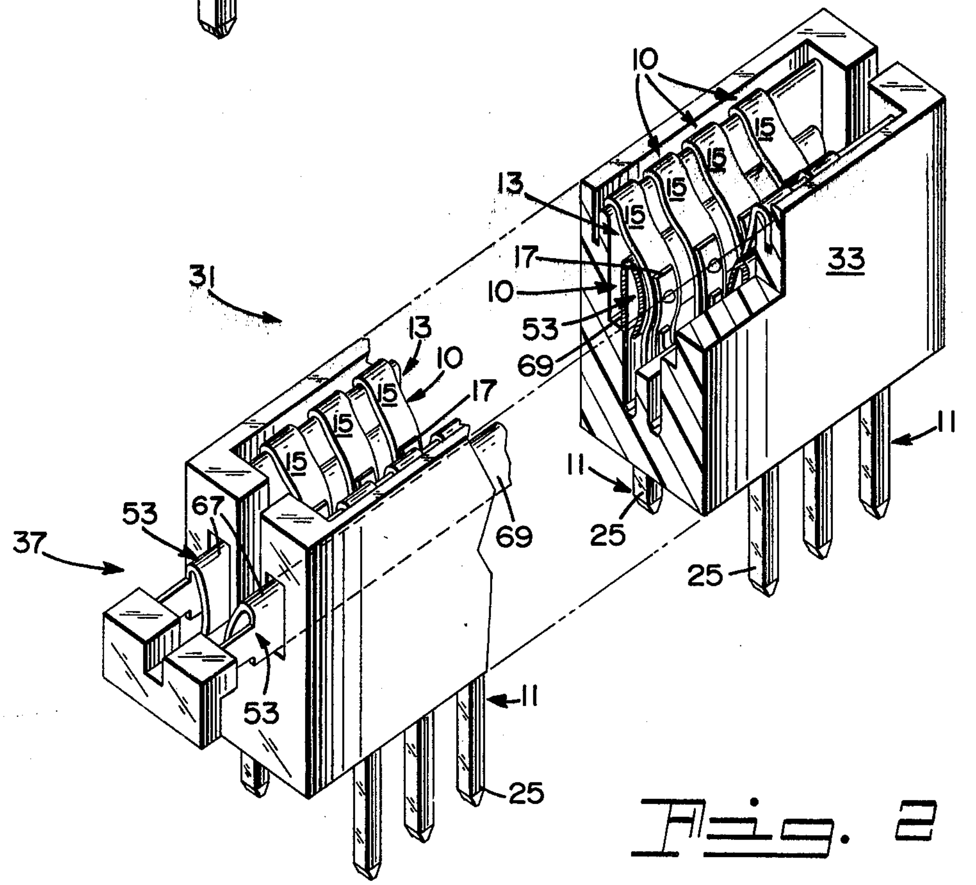
FIG. 2 is an isometric view of a zero force printed circuit board connector in accordance with another embodiment of the invention.
Figure 3:
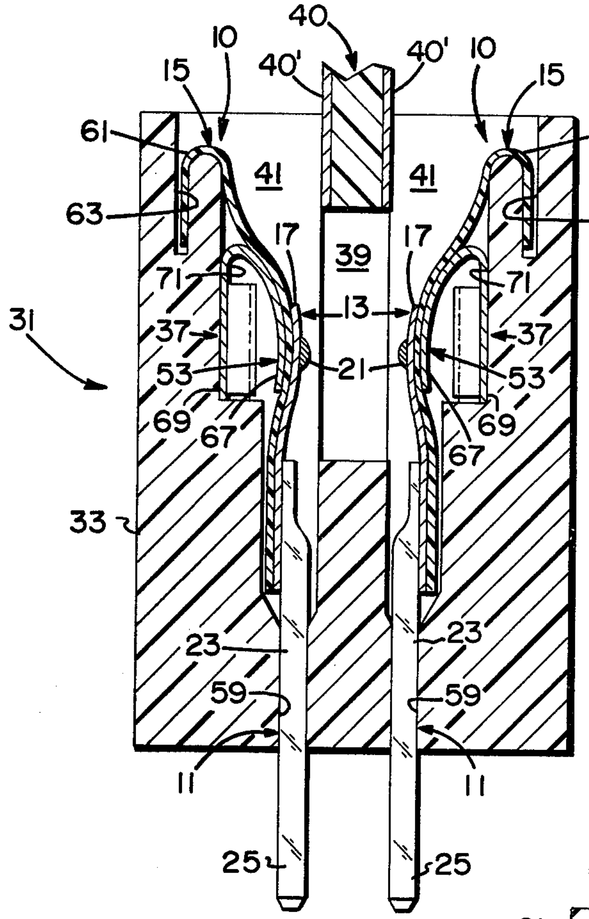
FIGS. 3 and 4 represent end elevational views, partly in section, of the connector of FIG. 2 illustrating the various positioning of the connector's components before and after board insertion.
Figure 4:
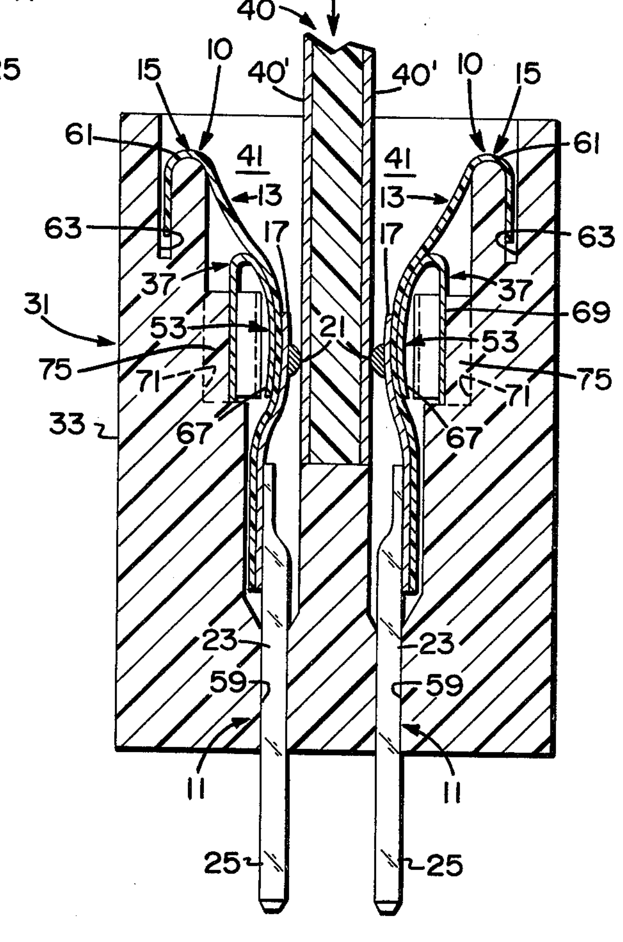
Figure 7:
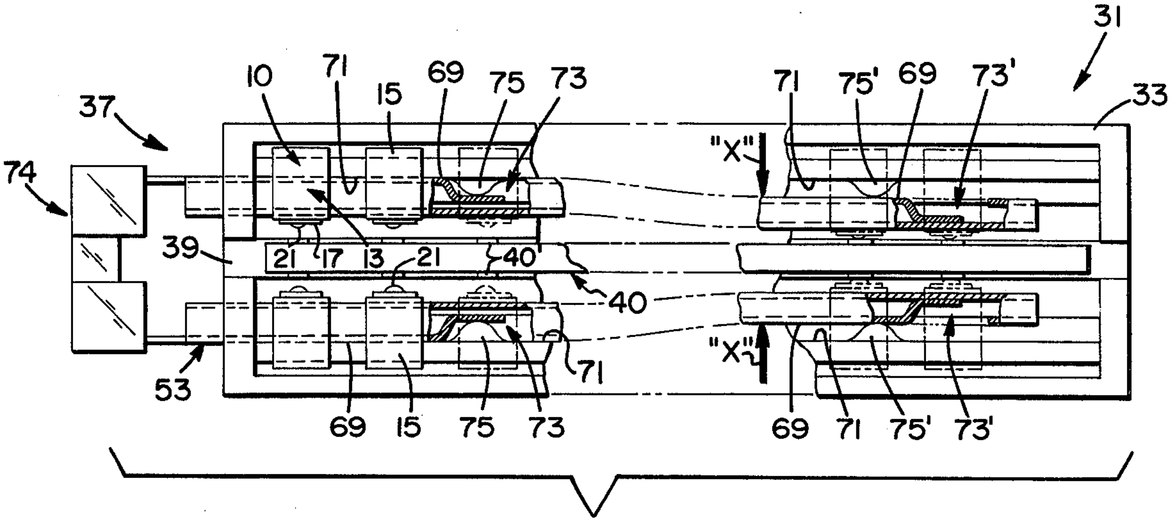

In reference to FIGS. 2–4, there is shown a zero force printed circuit board connector 31 in accordance with a preferred embodiment of the invention. Connector 31 comprises a housing 33 of electrically insulative material, e.g. plastic, at least one of the electrical contacts 10 defined in FIG. 1, and an actuation means 37 movably oriented within housing 33.

Housing 33 defines a first opening 39 for receiving a printed circuit board 40, and a pair of opposing second openings 41 adjacent and in communication with first opening 39. In accordance with the broader aspects of the invention, it is understood that connector 31 can include only one contact 10 therein. Accordingly, it will be understood with further description of the invention that housing 33 need only define one opening 41 because only one of said openings is required for each contact utilized. It is of course preferred to incorporate several, e.g. one-hundred, contacts within connector 31 to increase the operational capabilities of this component.

Each of the electrical contacts 10 in connector 31 comprises the aforementioned rigid electrically conductive body 11 and the substantially flexible contacting portion 13 for providing electrical contact between a conductive area 40′ on circuit board 40 and body 11. Contacting portion 13 is substantially positioned within second opening 41 and includes first segment 15 of electrically insulative material and second segment 17 of electrically conductive material secured to a selected area on first segment 15. The preferred embodiment for contact 10 used in connector 31 further includes the aforementioned second metallic material 21 secured to a selected region on the layered metallic material 17.

Second segment 17 of contacting portion 13 is adapted for electrically engaging one of the conductive areas 40′ on board 40 when the board is positioned within first opening 39 (FIG. 4). This engagement is provided when actuation means 37, preferably a movable metallic spring 53, slidably engages the insulative first segment 15 and forces segment 17 against conductive area 40′. Reference is particularly called to FIG. 4 wherein said engagement is clearly illustrated.

In the preferred embodiment of the invention, body 11 of contact 10 includes the aforementioned tail 25 which is adapted for extending from housing 33. Tail 25 is therefore capable of providing electrical engagement with an exterior conductive means, e.g. wire (not shown), or for being positioned within a second electrical connector or conductive means, e. g. printed circuit board, to thereby complete an electrical circuit between said components and the circuit board 40.

Contact 10 also preferably includes the aforementioned retention portion 23 adjoining tail 25 and adapted for retaining contact 10 within connector 31 by frictionally engaging the interior walls of an opening 59 provided within housing 33. Retention portion 23 may include a plurality of protruding retention members which are well known in the art and therefore not shown here. It is understood that in the broader aspects of the invention, retention portion 23 could be secured within opening 59 utilizing a glue, epoxy, or similar bonding agent. Mechanical locking means could be utilized rather than frictionally engaging the interior walls of an opening 59 to secure electrical contact within body 11. Contact 10 may also be molded or twisted within said insulating housing, thus eliminating the need for the aforementioned retention members.

The upper portions 61 of insulative first segment 15 are preferably retained within a slot 63 or similar opening provided within housing 33 relative to second opening 41.

Actuation means 37 is shown in FIGS. 2–5 as comprising two metallic springs 53 which each include a bowed engaging portion 67 for abutting insulative first segment 17 (FIGS. 3 and 4) and a base portion 69 for slidably engaging an upstanding wall 71 of second opening 41. It is understood that in the broader aspects of the invention actuation means 37 can comprise a singular metallic spring 53 rather than the dual embodiment shown in FIG. 5. A singular spring 53 would be utilized in connectors wherein a singular contact or row of contacts is employed. Each of the metallic springs 53 includes an extending portion 72 to which is secured a common actuation arm 74. Arm 74 is preferably of plastic material and is designed primarily to facilitate engagement and handling thereof by the connector's operator.

Base portion 69 is shown in FIGS. 5–8 as further including a plurality of spaced open portions 73 and 73′ therein, said openings adapted for aligning with a corresponding plurality of upstanding bumps or offsets 75 and 75′ positioned along walls 71. Offsets 75 and 75′ are spacedly positioned along walls 71 at substantially the same spacing for openings 73 and 73′ within each of the springs 53 of actuation means 37. When actuation means 37 is in the non-actuating condition depicted in FIG. 6, the mutual alignment of offsets 75 and 75′ and spaced openings 73 and 73′ permit each of the base portions 69 of springs 53 to remain flush against walls 71. Accordingly, each of the respective contacting portions 13 of contacts 10 are retained within second openings 41 (FIGS. 3 and 4) of the connector's housing and thus do not extend within first opening 39. This positioning relationship assures the zero force feature for connector 31 in that printed circuit board 40 can now be inserted within openings 39 without encountering interference by contacting portion 13.

Figure 8:
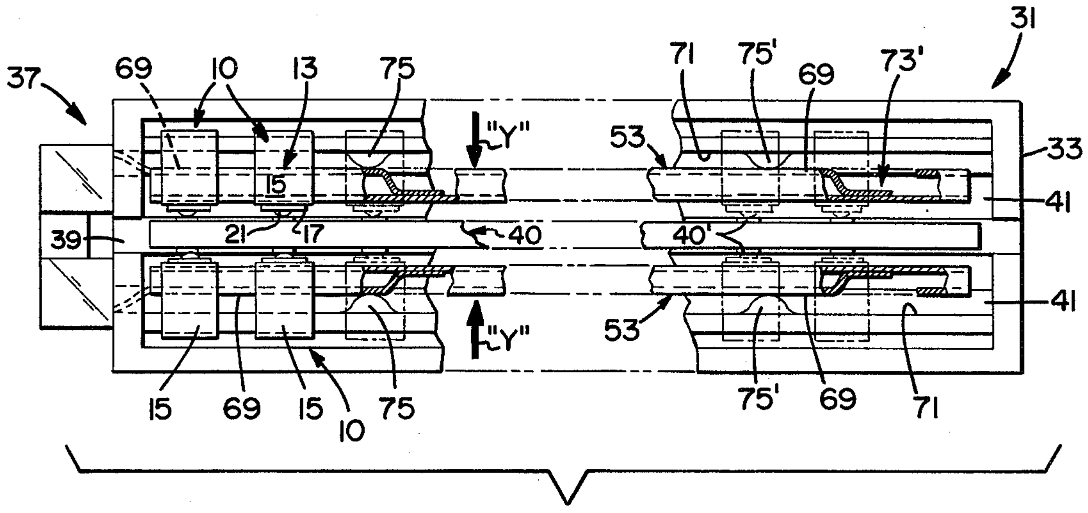

When board 40 is positioned within connector 31, actuation means 37 is pressed inwardly until reaching the fully inserted position shown in FIG. 8. During this movement base portion 69 of springs 53 ride over offsets 75 and 75'. Accordingly, engaging portions 67 of the springs force each of the contacting portions 13 inwardly toward first opening 39 until positive engagement between said contacting portions and the conductive areas 40' on board 40 is achieved. This engagement is also illustrated in FIG. 4.

Openings 73 are shown as being substantially larger than corresponding openings 73' within each of the springs 53. In the preferred embodiment of the invention, openings 73 are at least three times the size of openings 73' while the configurations for each of the offsets 75 and 75' are substantially identical. Accordingly, a means is provided whereby actuation means 37 progressively actuates the several contacting portions 13 spacedly positioned within connector 31. This progressive actuation is more clearly illustrated in FIG. 7 wherein the inward displacement (indicated by arrows "X") of springs 53 causes the base portions 69 of said springs located near openings 73' to slide over the adjacent offsets 75'. This motion in turn effects positive engagement between the contacts 10 located in this region of connector 31 and board 40. It can be seen in FIG. 7 that the offsets 75 located relative to openings 73 remain positioned therein. Accordingly, the base portion 69 in this region of the connector remain substantially flush against the walls 71.

When actuating means 37 is further inserted within connector 31, the base portions 69 located relative to openings 73 slidably engage offsets 75 to cause inward movement (indicated by arrows "Y") of the portions of springs 53 located in this region of the connector. Contacting portions 13 of contacts 10 in this region are therefore inwardly displaced. It is shown in the drawings that this latter movement does not occur until the contacts 10 positioned relative to that portion of springs 53 including openings 73' have been fully engaged.

The aforementioned progressive actuation of contacts 10 comprises one of the significant features of the invention. Progressive actuation is highly desirable when utilizing several, e.g. one-hundred, contacts within a singular connector. Such a large number of contacts in turn requires a relatively high actuation force. Thus it can be seen that the described progressive displacement of contacts 10 facilitates the actuation of these members.

It is further understood that with regard to the present invention when a plurality of contacts 10 are employed within connector 31, it is possible to utilize a common insulative portion 15 for all of the contacts occupying a single row within the connector. That is, insulative portion 15 can be produced from a singular strip of plastic material and thereafter be provided with the respective layers 17 of conductive material.

The described body portions 11 and second metals 21 can thereafter be secured to this singular member at the spaced locations for layers 17. The above method for producing the contacts of the invention possesses several advantages over the manufacturing processes of the prior art wherein contacts are produced singularly from a continuous wire or strip. Ease of operation, reduced manufacturing time, and significant reduction in cost of materials represent a few of said advantages.

It can be further understood that the above method assures a means whereby miniaturization of the contacts and their spacings may be attained. This represents a highly desirable feature of the invention due to the current emphasis in the contact and connector art to reduce spacing requirements.

Thus there has been shown and described an electrical contact and a zero force electrical connector which may be ideally suited for incorporating said contact therein. The contact and connector of the invention possess the several advantageous features as described, said features not available in contacts and connectors of the prior art.

While there has been shown and described what are at present considered the preferred embodiments of the invention, it will be obvious to those skilled in the art that various changes and modifications may be made therein without departing from the scope of the invention as defined by the appended claims.

What is claimed is:

1. A zero force printed circuit board comprising: a housing of electrically insulated material, said housing having a longitudinally extending central slot adapted to receive a printed circuit board, said housing having a plurality of contact receiving openings on both sides of the central slot, said contact receiving openings being in communication with the central slot, a contact carried within each of the contact receiving openings, each contact comprising a flexible base of electrically insulative material, each base having an outwardly directed portion acting as an electrical contact, an electrically conductive material on the outwardly directed portion of each flexible base, and a substantially rigid electrically conductive pin affixed to each base in electrical communication with the outwardly directed portion of each base, each aforesaid outwardly directed base portion acting as an electrical contact and facing inwardly toward the longitudinal slot whereby when a printed circuit board is positioned in said slot each aforesaid base portion will be adapted to electrically engage the printed circuit board, and actuation means for forcing each outwardly directed base portion into electrical engagement with the printed circuit board when positioned in the slot, said actuation means comprising longitudinal members slideably carried by the housing, each of said members having a portion positioned to engage the electrical contacts on an individual side away from the housing slot, cam means positioned in the housing to force the longitudinal members upon sliding movement thereto toward the housing slot so that the electrical contacts progressively engage the printed circuit board.

2. The invention as set forth in claim 1 and wherein each base is composed of plastic material.

3. The contact according to claim 2 wherein said plastic material is selected from the group consisting of nylon and Mylar.

4. The invention as set forth in claim 2 and wherein the electrically conductive material is a noble metal.

5. The invention as set forth in claim 1 and wherein the electrically conductive material on each base is a metal different from that of the electrically conductive pins.

6. The invention as set forth in claim 5 and wherein the metal on each base is a noble metal.

* * * * *